(12) United States Patent
Watanabe

(10) Patent No.: US 12,143,119 B2
(45) Date of Patent: Nov. 12, 2024

(54) ANALOG-TO-DIGITAL CONVERTER CIRCUIT

(71) Applicant: DENSO CORPORATION, Kariya (JP)

(72) Inventor: Takamoto Watanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 163 days.

(21) Appl. No.: 17/968,894

(22) Filed: Oct. 19, 2022

(65) Prior Publication Data

US 2023/0116954 A1   Apr. 20, 2023

(30) Foreign Application Priority Data

Oct. 20, 2021   (JP) .................................. 2021-171598

(51) Int. Cl.
*H03M 1/12*   (2006.01)
*H03M 1/60*   (2006.01)

(52) U.S. Cl.
CPC ......... *H03M 1/1245* (2013.01); *H03M 1/129* (2013.01); *H03M 1/124* (2013.01); *H03M 1/1255* (2013.01); *H03M 1/60* (2013.01)

(58) Field of Classification Search
CPC ...... H03M 1/1245; H03M 1/129; H03M 1/60; H03M 1/1255; H03M 1/124
See application file for complete search history.

(56) References Cited

U.S. PATENT DOCUMENTS

| 2015/0115925 A1* | 4/2015 | Teh ....................... H03M 1/068 323/283 |
| 2019/0334542 A1 | 10/2019 | Watanabe |

\* cited by examiner

*Primary Examiner* — Joseph J Lauture
(74) *Attorney, Agent, or Firm* — Posz Law Group, PLC

(57) ABSTRACT

In an analog-to-digital converter circuit, a sum output unit calculates the sum of an n-bit data value outputted from a first output unit and an (n+1)-bit data value outputted from a second output unit to accordingly obtain the calculated sum as a digital data value. A second calculator of the second output unit calculates the sum of a sign bit of a third digital data value as a most significant bit thereof and a second significant bit of the third digital data value. The combines a bit selected from the calculated sum with the third digital data value from which the sign bit has been eliminated to accordingly generate, as the (n+1)-bit data value, a new digital data value whose most significant bit is the bit selected from the calculated sum.

5 Claims, 8 Drawing Sheets

17(1)-13=4

|  | MSB |
|---|---|
| 1= | 0001 |
| 13= | 1101 |
| 13b= | 0010 |
| 13b+1= | 0011 [-13] |
| 1+[-13]= | 0001 |
|  | +0011 |
|  | =0100 |
|  | =4 |

|  | MSB |
|---|---|
| 3= | 0011 |
| 13= | 1101 |
| 13b= | 0010 |
| 13b+1= | 0011 [-13] |
| 3+[-13]= | 0011 |
|  | +0011 |
|  | =0110 |
|  | =6 |

```
                    MSB
                     ↓
1 =              00001
─────────────────────────
13 =             01101
13b =            10010
13b+1 =          10011 [-13]
─────────────────────────
1+[-13] =        00001
               + 10010
─────────────────────────
               = 10100
               = 20
```

```
            SGB    MSB
              ↓     ↓
1 =              000001
─────────────────────────
13 =             001101
13b =            110010
13b+1 =          110011 [-13]
─────────────────────────
1+[-13] =        000001
               + 110010
─────────────────────────
               = 110100
               = 00100
               = 4
```

FIG. 6B

ANALOG-TO-DIGITAL CONVERTER CIRCUIT

CROSS-REFERENCE TO RELATED APPLICATION

This application is based on and claims the benefit of priority from earlier Japanese Patent Application No. 2021-171598 filed on Oct. 20, 2021, the entire disclosure of which is incorporated herein by reference.

TECHNICAL FIELD

The present disclosure relates to analog-to-digital (A/D) converter circuits for digitizing predetermined analog information.

BACKGROUND

An example digitizing apparatus is comprised of a pair of first and second pulse delay circuits, each of which is comprised of a plurality of delay units that are connected in a ring-like cascade structure to each other.

SUMMARY

In an analog-to-digital converter circuit according to an aspect of the present disclosure, a sum output unit calculates the sum of an n-bit data value outputted from a first output unit and an (n+1)-bit data value outputted from a second output unit to accordingly obtain the calculated sum as a digital data value. A second calculator of the second output unit calculates the sum of a sign bit of a third digital data value as a most significant bit thereof and a second significant bit of the third digital data value. The combines a bit selected from the calculated sum with the third digital data value from which the sign bit has been eliminated to accordingly generate, as the (n+1)-bit data value, a new digital data value whose most significant bit is the bit selected from the calculated sum.

BRIEF DESCRIPTION OF THE DRAWINGS

Other aspects of the present disclosure will become apparent from the following description of embodiments with reference to the accompanying drawings in which:

FIG. 5A is a diagram schematically illustrating a usual calculation example illustrated in FIG. 1;

FIG. 5B is a diagram schematically illustrating a calculation example carried out by a first digitizing unit;

FIG. 6A is a diagram schematically illustrating a conventional anomalous calculation example carried out by the second digitizing unit under the following condition that no sign bit is used;

FIG. 6B is a diagram schematically illustrating a correct calculation example carried out by the second digitizing unit;

DETAILED DESCRIPTION OF EMBODIMENTS

Figure 1:
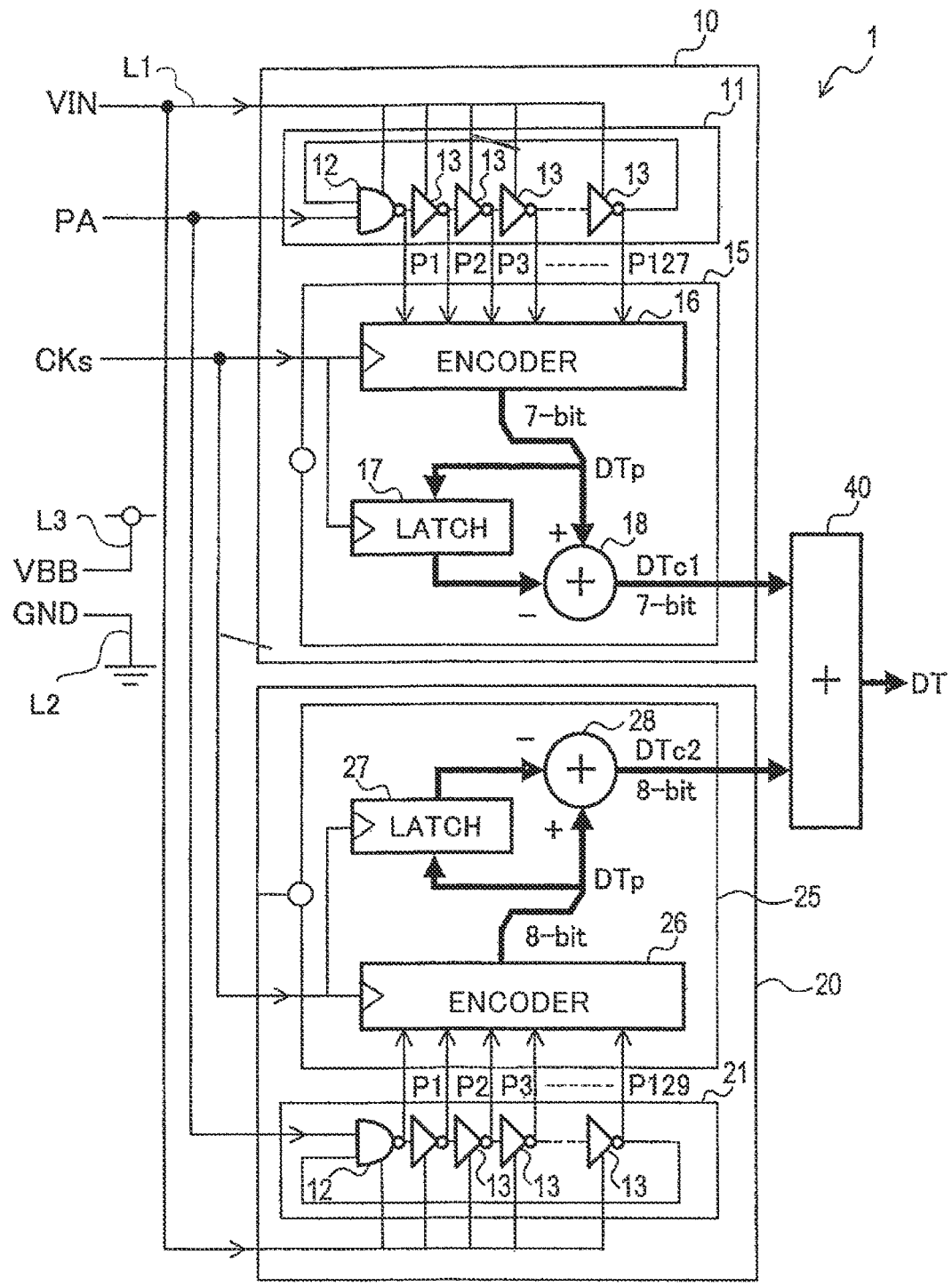
FIG. 1 is a block diagram illustrating a schematic configuration of an A/D converter according to an exemplary embodiment of the present disclosure.

Japanese Patent Application Publication No. 2018-182561 discloses a digitizing apparatus comprised of a pair of first and second pulse delay circuits. The first pulse delay circuit is comprised of a plurality of delay units that are connected in a ring-like cascade structure to each other. Similarly, the second pulse delay circuit is comprised of a plurality of delay units that are connected in a ring-like cascade structure to each other. The number of delay units included in the first pulse delay circuit is larger than the number of delay units included in the second pulse delay circuit.

Each of the delay units includes various gate circuits.

The plurality of delay units included in each of the first and second pulse delay circuits correspond to a plurality of stages of delay.

Each delay unit included in each of the first and second pulse delay circuits is connected between a positive power line and a negative power line, and an analog input voltage, which is a digitizing target, is configured to be supplied across each delay unit via the positive and negative power lines.

The digitizing apparatus disclosed in the patent publication is configured such that a pulse signal inputted to one of the delay units of each of the first and second pulse delay circuits is sequentially transferred through the delay units of the corresponding one of the first and second delay circuits while being delayed thereby. When the pulse signal is transferred through each delay unit, a transfer speed of the pulse signal through the corresponding delay unit is determined based on a delay time of the pulse signal through the corresponding delay unit; the delay time of the pulse signal through each delay unit depends on the power supply voltage for the corresponding delay unit.

Counting (i) the number of stages, i.e., delay units, in the plurality of delay units of the first pulse delay circuit through which the pulse signal has passed during a predetermined sample period and (ii) the number of stages, i.e., delay units, in the plurality of delay units of the second pulse delay circuit through which the pulse signal has passed during the predetermined sample period enables the analog input voltage to be converted into digital numeric data. Making larger the sample period and faster the delay time of each delay unit enables the A/D converter circuit to have a higher resolution and a higher conversion speed.

In particular, the digitizing apparatus includes first and second subtractors corresponding to the respective first and second pulse delay circuits. The first subtractor subtracts, from a current data value outputted from the first pulse delay circuit at the timing when any sampling period has elapsed, a previous data value outputted from the first pulse delay circuit immediately before the current data value to accordingly calculate a data value as a result of the subtraction. The data value as the result of the subtraction of the first subtractor shows the number of delay units in the first pulse delay circuit through which the pulse signal has passed during the sampling period.

Similarly, the second subtractor subtracts, from a current data value outputted from the second pulse delay circuit at the timing when any sampling period has elapsed, a previous data value outputted from the second pulse delay circuit immediately before the current data value to accordingly calculate a data value as a result of the subtraction. The data value as the result of the subtraction of the second subtractor shows the number of delay units in the second pulse delay circuit through which the pulse signal has passed during the sampling period.

Each data value outputted from the first pulse delay circuit, whose number of delay units is larger than that of delay units of the second pulse delay circuit, consists of a predetermined number of bits. Similarly, each data value outputted from the second pulse delay circuit consists of a predetermined number of bits; the predetermined number of bits of each data value outputted from the first pulse delay circuit is set to be greater by 1 bit than that outputted from the second pulse delay circuit.

In the above structure of the digitizing apparatus disclosed in the patent publication, if there is a condition, which is called "overflow", where the pulse signal returns from the last delay unit to the beginning delay unit in, for example, the first pulse delay circuit, the overflow of the first pulse delay circuit may result in an anomalous data value as the result of the subtraction of the first subtractor as compared with a correct (right) data value as the result of the subtraction of the first subtractor.

From this viewpoint, the present disclosure aims to provide analog-to-digital converter circuits, each of which is capable of digitizing predetermined analog information with a higher accuracy while maintaining a higher digitizing speed and a higher resolution.

An exemplary measure according to the present disclosure provides an analog-to-digital converter circuit for digitizing predetermined analog information. The analog-to-digital converter circuit includes a first digitizing unit that includes a first pulse delay circuit and a first output unit.

The first pulse delay circuit includes a predetermined number of first delay units connected in series to one another. The predetermined number of first delay units is ($2^n-p$). Each of n and p is individually a natural number. Each first delay unit is configured such that an analog signal having a voltage is inputted thereto. The first pulse delay circuit is configured to transfer a pulse signal therethrough while the pulse signal is 20 delayed by each first delay unit. A delay time of each first delay unit depends on a voltage of the analog signal.

The first output unit is configured to output a first n-bit data value based on the number of first delay units in the first pulse delay circuit through which the pulse signal has passed.

The analog-to-digital converter circuit includes a second digitizing unit that includes a second pulse delay circuit and a second output unit.

The second pulse delay circuit includes a predetermined number of second delay units connected in series to one another. The predetermined number of second delay units is ($2^n+p$). Each second delay unit is configured such that the analog signal is inputted thereto. The second pulse delay circuit is configured to transfer the pulse signal therethrough while the pulse signal is delayed by each second delay unit. A delay time of each second delay unit depends on the voltage of the analog signal.

The second output unit is configured to output a second (n+1)-bit data value based on the number of second delay units in the second pulse delay circuit through which the pulse signal has passed.

The analog-to-digital converter circuit includes a sum output unit. The sum output unit is configured to calculate the sum of the n-bit data value outputted from the first output unit and the (n+1)-bit data value outputted from the second output unit to accordingly obtain the calculated sum as a digital data value.

The second output unit includes an encoder configured to encode, every predetermined period, the number of second delay units in the second pulse delay circuit through which the pulse signal has passed, to accordingly generate, every predetermined period, a digital data value.

The second output unit includes a first calculator configured to
(I) Attach, to a newest digital data value, a sign bit as a most significant bit of the newest digital data value to thereby calculate a first digital data value
(II) Attach, to a previous digital data value generated immediately previous to the newest digital data value, the same sign bit as the most significant bit of the previous digital data value to thereby calculate a second digital data value
(III) Perform subtraction of the second digital data value from the first digital data value to accordingly calculate a third digital data value The second output unit includes a second calculator configured to
(i) Calculate the sum of a sign bit of the third digital data value as a most significant bit thereof and a second significant bit of the third digital data value
(ii) Combine a bit selected from the calculated sum of the sign bit and the second most significant bit with the third digital data value from which the sign bit has been eliminated to accordingly generate, as the (n+1)-bit data value, a new digital data value whose most significant bit is the bit selected from the calculated sum of the sign bit and the second most significant bit This configuration of the analog-to-digital converter circuit makes it possible to prevent a calculation decision of the analog-to-digital converter circuit from becoming an anomalous value due to, for example, the occurrence of the overflow of, for example, the second pulse delay circuit.

Additionally, making faster the delay time of each of the first and second delay units enables the analog-to-digital converter circuit to have a faster digitizing speed. This therefore offers the analog-to-digital converter circuit with a higher accuracy while maintaining a faster digitizing speed.

In view of the above circumstances, the following describes an exemplary embodiment of the present disclosure with reference to the accompanying drawings.

The following describes an A/D converter 1, which is an example of A/D converter circuits, according to the exemplary embodiment with reference to FIGS. 1 to 8.

The A/D converter 1 illustrated in FIG. 1 serves as a circuit that outputs a digital value based on a voltage, i.e., potential, of an input analog signal.

Specifically, the A/D converter 1 includes a first digitizing unit 10, a second digitizing unit 20, and a sum output unit 40.

Each of the first and second digitizing units 10 and 20 is arranged such that a bias voltage VBB, a ground voltage GND, a pulse signal PA, a reference clock CKs, and an analog signal VIN having a voltage (potential) are inputted to the corresponding one of the first and second digitizing units 10 and 20. The reference clock CKs consists of periodic clock pulses having a period Ts (see FIG. 3A).

Each of the first and second digitizing units 10 and 20 serves as a known time-based A/D converter for converting the analog signal VIN into digital numeric data.

The digital numeric data converted by the first digitizing unit 10, which will also be referred to as a binary data value DTc1, corresponds to a digital value of the voltage of the analog signal VIN, and the digital numeric data converted by the second digitizing unit 20, which will also be referred to as a binary data value DTc2, corresponds to a digital value of the voltage of the analog signal VIN.

The binary data value DTc1 and the binary data value DTc2 are inputted to the sum output unit 40.

The sum output unit 40 is configured to calculate the sum of the binary data value DTc1 and the binary data value DTc2, which can be represented by (DTc1+DTc2), to accordingly obtain a digital data value DT; the digital data value DT is the result of analog-to-digital conversion of the analog signal VIN.

The first digitizing unit 10 is comprised of a ring-like pulse delay circuit 11 and a first output unit 15, and the second digitizing unit 20 is comprised of a ring-like pulse delay circuit 21 and a second output unit 25.

The pulse delay circuit 11 is comprised of X delay units 12, 13 connected in series to one another in a ring form; the number X of delay units 12, 13 serves as the number X of stages of delay. The pulse delay circuit 11 will also be referred to as a ring delay line. The number X is set to an odd number of, for example, 127, i.e., $(2^{n=7}-1)$.

Similarly, the pulse delay circuit 21 is comprised of m delay units 12, 13 connected in series to one another in a ring form; the number Y of delay units 12, 13 serves as the number Y of stages of delay. The pulse delay circuit 21 will also be referred to as a ring delay line. The number Y is set to an odd number of, for example, 129, i.e., $(2^{n=7}+1)$.

The delay unit 12 serving as the first stage of delay in the pulse delay circuit 11, which will also be referred to as a first delay unit in the pulse delay circuit 11, is a negative AND (NAND) gate 12. The remaining delay units 13 serving as the second to nth delay units, i.e., the second to nth stages of delay, in the pulse delay circuit 11 are respectively inverters, i.e., NOT gates, 13.

That is, the pulse delay circuit 11 is comprised of the single NAND gate 12 and the (X−1=126) inverters 13.

Similarly, the delay unit 12 serving as the first stage of delay in the pulse delay circuit 21, which will also be referred to as a first delay unit in the pulse delay circuit 21, is a NAND gate 12. The remaining delay units 13 serving as the second to mth delay units, i.e., the second to mth stages of delay, in the pulse delay circuit 21 are respectively inverters, i.e., NOT gates, 13.

That is, the pulse delay circuit 12 is comprised of the single NAND gate 12 and the (Y−1=128) inverters 13.

The first delay unit (NAND gate) 12 of each of the pulse delay circuits 11 and 21 has first and second input terminals and an output terminal, and the pulse signal PA is inputted to the first input terminal of the first delay unit 12 of each of the pulse delay circuits 11 and 21. Each of the remaining delay units 13 of each of the pulse delay circuits 11 and 21 has an input terminal and an output terminal.

The input terminal of each delay unit 13 of each of the pulse delay circuits 11 and 21 is cascade-connected to the output terminal of the immediately previous stage delay unit. The output terminal of the last stage delay unit 13 of each of the pulse delay circuits 11 and 21 is connected to the second input terminal of the first delay unit 12.

The output terminals of the respective delay units 12, 13 of the pulse delay circuit 11 are connected to the first output unit 15, so that outputs P1 to P127 of the respective first delay unit 12 to the 127-th delay unit 13 are therefore inputted to the first output unit 15.

The first output unit 15 includes an encoder 16, a latch 17, and an adder 18.

Similarly, the output terminals of the respective delay units 12, 13 of the pulse delay circuit 21 are connected to the second output unit 205, so that outputs P1 to P129 of the respective first delay unit 12 to the 129-th delay unit 13 are therefore inputted to the second output unit 25.

The second output unit 25 includes an encoder 26, a latch 27, and an adder 28.

Figure 2:
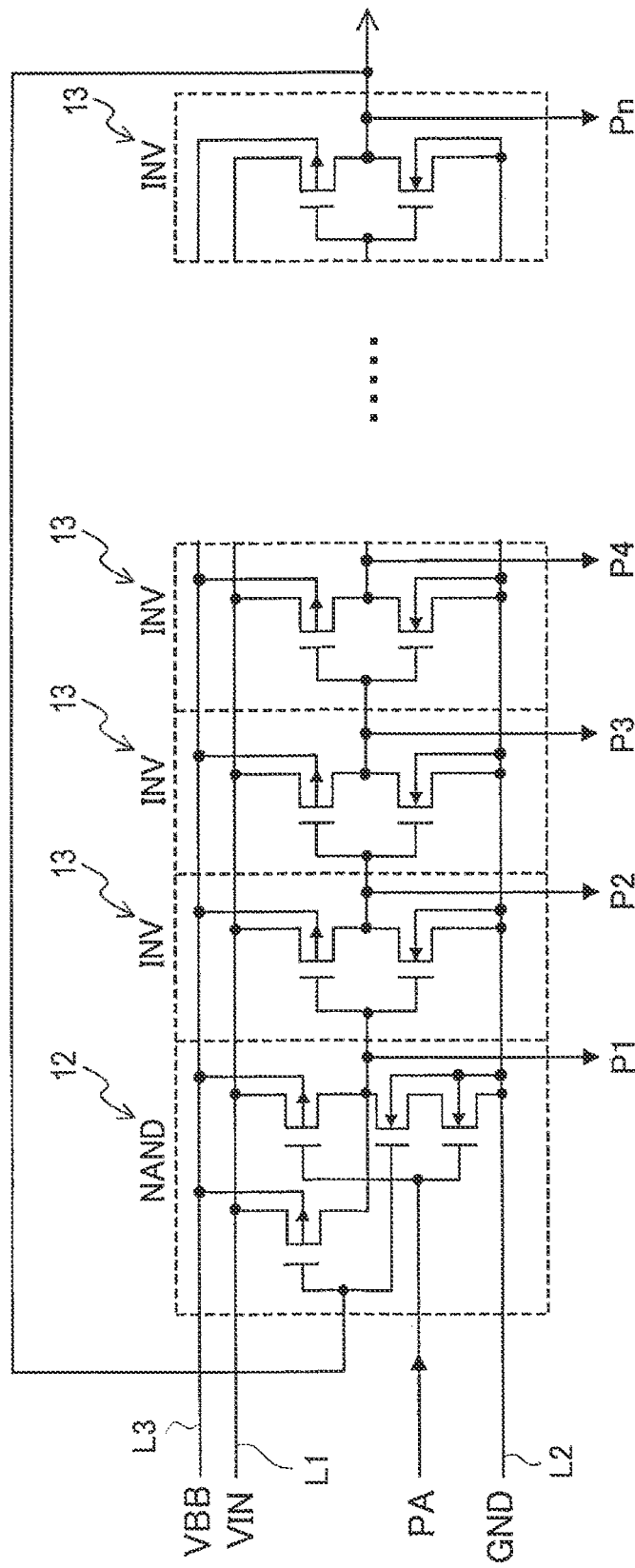
FIG. 2 is a circuit diagram illustrating a schematic configuration of each ring-like pulse delay circuit illustrated in FIG. 1.

Each delay unit 12 has first and second power supply terminals, first and second ground terminals, and first and second bias terminals (see FIG. 2), and each delay unit 13 has a power supply terminal, a ground terminal, and a bias terminal (see FIG. 2).

As illustrated in FIG. 2, each delay unit (NAND gate) 12 is designed as a CMOS NAND gate comprised of a first pair of first N- and P-channel MOSFETs and a second pair of second N- and P-channel MOSFETS. The first and second P-channel MOSFETs are connected in parallel to one another, and the first and second N-channel MOSFETs are connected in series to one another.

The gate of the first P-channel MOSFET and the gate of the first N-channel MOSFET are connected to one another to serve as the first input terminal, and the gate of the second P-channel MOSFET and the gate of the second N-channel MOSFET are connected to one another to serve as the second input terminal. The drains of the first and second P-channel MOSFETS are connected to the drain of the second N-channel MOSFET to serve as the output terminal.

Each inverter (NOT gate) 13 is designed as a CMOS inverter comprised of a pair of N- and P-channel MOSFETs whose gates are connected to each other to serve as the input terminal thereof and whose sources are connected to each other to serve as the output terminal thereof.

The A/D converter 1 includes a positive power supply line L1, a negative power supply line L2, and a bias supply line L3.

Referring to FIG. 2, the positive power supply line L1 is connected to the first and second power supply terminals, i.e., the sources of the first and second P-channel MOSFETs, of each delay unit 12 and to the power supply terminal, i.e., the source of the P-channel MOSFET, of each delay unit 13.

The negative power supply line L2 is connected to the first and second ground terminals, i.e., the sources, of each delay unit 12 and to the ground terminal of each delay unit 13.

The bias supply line L3 is connected to the first and second bias terminals of each delay unit 12 and to the bias terminal of each delay unit 13.

The analog signal VIN is inputted through the positive power supply line L1 to the first and second power supply terminals of each delay unit 12 and to the power supply terminal of each delay unit 13. The negative power supply line L2 has the ground voltage GND that is set to a reference voltage that is lower than the voltage of the analog signal VIN, such as 0 volts (V), so that the negative power supply line L2 serves as a signal common for the delay units 12 and 13.

The voltage of the analog signal VIN is therefore supplied to each of the delay units 12 and 13 as a power supply voltage, so that the power supply voltage inputted to each of the delay units 12 and 13 activates the corresponding one of the delay units 12 and 13.

Each delay unit 12, 13 of each pulse delay circuit 11, 21 is configured such that an operating time of the corresponding delay unit depends on the voltage of the analog signal VIN, resulting in the delay time of each delay unit 12, 13 depending on the voltage of the analog signal VIN.

When the pulse signal PA is input to the first input terminal of the first delay unit 12 of the pulse delay circuit 11, the first delay unit 12 works to transfer the pulse signal PA to the next delay unit 13 while delaying the pulse signal by a time of delay; the time of delay of each delay unit 12, 13 depends on the voltage of the analog signal VIN inputted to the corresponding delay unit.

Each of the remaining second to (X−1)th delay units 13 except for the last delay unit 13 of the pulse delay circuit 11 sequentially transfers the pulse signal PA transferred from the immediately previous delay unit to the next delay unit while delaying the pulse signal by the predetermined time of delay. The last delay unit 13 of the pulse delay circuit 11 transfers the pulse signal PA transferred from the immediately previous delay unit to the next first delay unit 12 while delaying the pulse signal by the predetermined time of delay, so that the pulse signal PA returns from the last delay unit 13 to the first delay unit 12 of the pulse delay circuit 11, 21, i.e., the overflow of the pulse delay circuit 11 occurs.

Similarly, when the pulse signal PA is input to the second input terminal of the first delay unit 12 of the pulse delay circuit 21, the first delay unit 12 works to transfer the pulse signal PA to the next delay unit 13 while delaying the pulse signal by a time of delay; the time of delay of each delay unit 12, 13 depends on the voltage of the analog signal VIN inputted to the corresponding delay unit.

Each of the remaining second to (Y−1)th delay units 13 except for the last delay unit 13 sequentially transfers the pulse signal PA transferred from the immediately previous delay unit to the next delay unit while delaying the pulse signal by the predetermined time of delay, so that the pulse signal PA returns from the last delay unit 13 to the first delay unit 12 of the pulse delay circuit 12, i.e., the overflow of the pulse delay circuit 12 occurs.

The last delay unit 13 transfers the pulse signal PA transferred from the immediately previous delay unit to the next first delay unit 12 while delaying the pulse signal by the predetermined time of delay.

As described above, the time of delay of each delay unit 12, 13 depends on the voltage of the analog signal VIN inputted to the corresponding delay unit. For this reason, the rate of transfer of the pulse signal PA passing through any delay unit 12 or 13 depends on the voltage of the analog signal VIN inputted to the delay unit 12 or 13.

The passing of the pulse signal PA through each delay unit 12 represents inversion of an output level of the corresponding delay unit 12 from a low level to a high level or from the high level to the low level in response to level change of the first input terminal (the gates of the first P- and N-channel MOSFETs) of the corresponding delay unit 12 from the low level to the high level or from the high level to the low level; the level change of the first input terminal of the corresponding delay unit 12 is generated in response to the pulse signal PA reaching the first input terminal of the corresponding delay unit 12

Similarly, the passing of the pulse signal PA through each delay unit 13 represents inversion of the output level of the corresponding delay unit 13 from the low level to the high level or from the high level to the low level in response to level change of the input terminal (the gate of the P- and N-channel MOSFETs) of the corresponding delay unit 13 from the low level to the high level or from the high level to the low level; the level change of the first input terminal of the corresponding delay unit 13 is generated in response to the pulse signal PA reaching the input terminal of the corresponding delay unit 13.

After the passing of the pulse signal PA through any delay unit 12 or 13, the pulse signal PA is inputted to the next delay unit 12 or 13. That is, in each of the ring-like pulse delay circuits 11 and 21, the sequential passing and inputting of the pulse signal PA is successively carried out through the delay units 12 and 13 in a chain reaction.

The rate of transfer of the pulse signal PA for each pulse delay circuit 11, 21 can be expressed as the number of delay units in the corresponding pulse delay circuit 11, 21 through which the pulse signal PA per unit of time. That is, an increase in the rate of transfer of the pulse signal PA for each pulse delay circuit 11, 21 increases the number of delay units in the corresponding pulse delay circuit 11, 21 through which the pulse signal PA per unit of time.

For example, FIG. 3B shows how the output P1 of the first delay unit 12 of, for example, the pulse delay circuit 11 changes over time on condition that the voltage of the analog signal VIN is set to a predetermined high value. FIG. 3C shows how the output P1 of the first delay unit 12 of, for example, the pulse delay circuit 11 changes over time on condition that the voltage of the analog signal VIN is set to a predetermined middle value lower than the high value. FIG. 3D shows how the output P1 of the first delay unit 12 of, for example, the pulse delay circuit 11 changes over time on condition that the voltage of the analog signal VIN is set to a predetermined low value lower than the middle value.

That is, the level of the output P1 of the first delay unit 12 of the pulse delay circuit 11 is inverted each time the pulse signal PA returns from the last delay unit 13 to the first delay unit 12, i.e., each time the overflow of the pulse delay circuit 11 occurs. That is, a period for which the level of the output P1 of the first delay unit 12 is maintained at the high or low level (see reference character Trd1 in each of FIGS. 3B to 3D) shows an overflow period so that the overflow of the pulse delay circuit 11 occurs every overflow period.

FIGS. 3B to 3D show that an increase in the voltage of the analog signal VIN results in a decrease in the overflow period Trd1, resulting in an increase in the frequency of the overflow of the pulse delay circuit 11.

This can be similarly established for the pulse delay circuit 21.

As described in detail later, the overflow of each of the pulse delay circuits 11 and 21 can show a situation where an output DTp of the corresponding one of the encoders 16 and 26, which has become its maximum value, returns to zero.

FIGS. 3B to 3D additionally show that a decrease in the voltage of the analog signal VIN results in an increase in the overflow period Trd1, resulting in a decrease in the frequency of the overflow of the pulse delay circuit 11.

As illustrated in FIG. 2, the bias voltage VBB is inputted to the first and second bias terminals of each delay unit 12, and to the bias terminal of each delay unit 13 through the bias supply line L3. The rate of transfer of the pulse signal PA passing through any delay unit 12 or 13 also depends on the bias voltage VBB inputted to the delay unit 12 or 13.

Each of the encoders 16 and 26 is designed as, for example, a latch encoder.

The encoder 16 is configured to (I) Capture the outputs P1 to P127, each of which has the high level or low level, of the respective first to 127-th delay units 12 and 13 of the pulse delay circuit 11 for each cyclic timing defined by the reference clock CKs (II) Encode, based on the captured outputs P1 to P127, a position of the pulse signal PA at the corresponding cyclic timing, i.e., one of the delay units 12 and 13 through which the pulse signal PA has just passed at the corresponding cyclic timing, to thereby generate the output DTp representing the position of the pulse signal PA at the corresponding cyclic timing Similarly, the encoder 26 is configured to
(I) Capture the outputs P1 to P129, each of which has the high level or low level, of the respective first to 129-th delay units 12 and 13 of the pulse delay circuit 21 for each cyclic timing defined by the reference clock CKs
(II) Encode, based on the captured outputs P1 to P129, a position of the pulse signal PA at the corresponding cyclic timing, i.e., one of the delay units 12 and 13 through which the pulse signal PA has just passed at the corresponding cyclic timing, to thereby generate the output DTp representing the position of the pulse signal PA at the corresponding cyclic timing The output DTp of the encoder 16 is expressed as a binary data value of 7 bits, because the number of the captured outputs P1 to P127 from the pulse delay circuit 11 is 127, i.e., $(2^7-1)$, so that 7-bit digital data is adequate for expressing the captured outputs P1 to P127 from the pulse delay circuit 11.

Similarly, the output DTp of the encoder 26 is expressed as a binary data value of 8 bits, which is higher by 1 bit than the 7-bit output DTp of the encoder 16, because the number of the captured outputs P1 to P129 from the pulse delay circuit 11 is 129, i.e., $(2^7+1)$, so that 8-bit digital data is required for expressing the captured outputs P1 to P129 from the pulse delay circuit 21.

The output DTp of the encoder 16 is inputted to both the latch 17 and the adder 18, and the output DTp of the encoder 26 is similarly inputted to both the latch 27 and the adder 28.

The latch 17 is configured to
(1) Latch the newest output DTp inputted thereto from the encoder 16 at each cyclic timing
(2) Output, as a comparison value, an immediately previous output DTp latched at the immediately previous timing relative to the corresponding cyclic timing to the adder 18

Similarly, the latch 27 is configured to
(1) Latch the newest output DTp inputted thereto from the encoder 26 at each cyclic timing
(2) Output, as a comparison value, an immediately previous output DTp latched at the immediately previous timing relative to the corresponding cyclic timing to the adder 28

The adder 18 is configured to subtract, from the newest output DTp of the encoder 16, the comparison value, i.e., the immediately previous latched output DTp, outputted from the latch 17. Similarly, the adder 28 is configured to subtract, from the newest output DTp of the encoder 26, the comparison value, i.e., the immediately previous latched output DTp, outputted from the latch 27.

For example, let us assume that the outputs P1 to P127 of the pulse delay circuit 11 are captured for every predetermined number of cycles of the reference clock CKs, and the outputs P1 to P129 of the pulse delay circuit 12 are similarly captured for every predetermined number of cycles of the reference clock CKs.

In this assumption, the adder 18 is configured to subtract, from the newest output DTp of the encoder 16 captured at the timing when the predetermined number of cycles of the reference clock CKs has elapsed, the comparison value, i.e., the immediately previous latched output DTp, latched for the predetermined number of cycles of the reference clock CKs. In other words, the adder 18 is configured to subtract, from the newest position of the pulse signal PA at the timing when the predetermined number of cycles of the reference clock CKs has elapsed, the immediately previous position of the pulse signal PA before lapse of the predetermined number of cycles of the reference clock CKs.

Similarly, the adder 28 is configured to subtract, from the newest output DTp of the encoder 26 captured at the timing when the predetermined number of cycles of the reference clock CKs has elapsed, the comparison value, i.e., the immediately previous latched output DTp, latched for the predetermined number of cycles of the reference clock CKs. In other words, the adder 28 is configured to subtract, from the newest position of the pulse signal PA at the timing when the predetermined number of cycles of the reference clock CKs has elapsed, the immediately previous position of the pulse signal PA before lapse of the predetermined number of cycles of the reference clock CKs.

For example, the adder 18 is configured to convert the 7-bit comparison value, i.e., the 7-bit immediately previous latched output DTp, into a corresponding two's complement, and calculate the sum of the 7-bit newest output DTp of the encoder 16 and the two's complement of the 7-bit comparison value to thereby obtain a binary data value DTc1.

Similarly, the adder 28 is configured to convert the 8-bit comparison value, i.e., the 8-bit immediately previous latched output DTp, into a corresponding two's complement, and calculate the sum of the 8-bit newest output DTp of the encoder 26 and the two's complement of the 8-bit comparison value to thereby obtain a binary data value DTc2.

Figure 4:
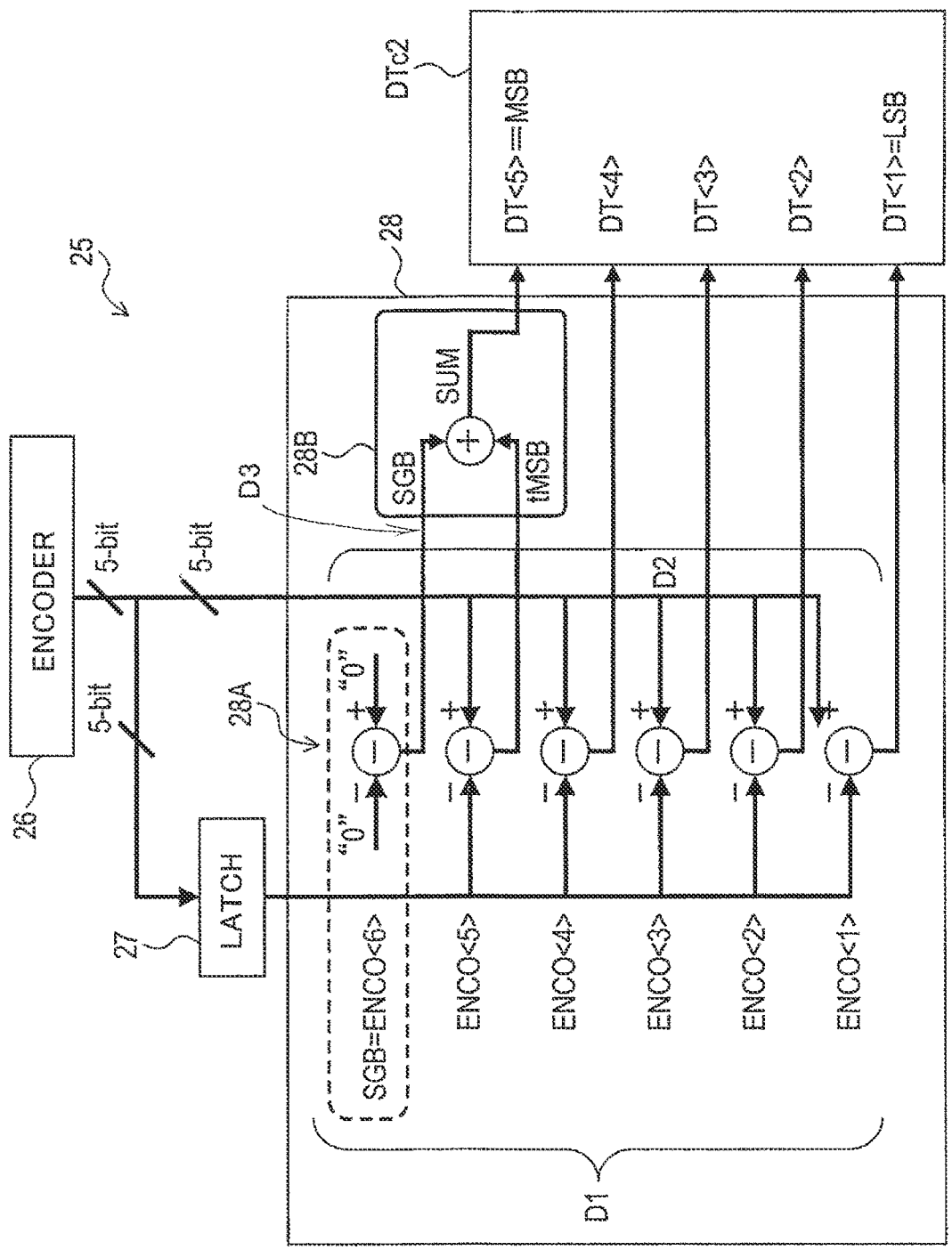
FIG. 4 is a circuit diagram illustrating a schematic configuration of a second digitizing unit illustrated in FIG. 1.

In particular, the adder 28 of the second digitizing unit 20 is comprised of, as illustrated in FIG. 4, a first calculator 28A and a second calculator 28B.

The following describes how each of the first output unit 15 and the second output unit 25 calculates the corresponding one of the binary data values DTc1 and DTc2. For the sake of simple description of the calculation, let us assume that the pulse delay circuit 11 is comprised of X delay units 12, 13; the number X is set to 15, i.e., $(2^{n=4}-1)$, and the pulse delay unit 21 is comprised of Y delay units 12, 13; the number Y is set to 17, i.e., $(2^{n=4}+1)$.

In this assumption, the output DTp of the encoder 16 of the first output unit 15 is a binary 4-bit data value, and the output DTp of the encoder 26 is a binary 5-bit data value.

The first calculator 28A is configured to, as illustrated in FIG. 4, attach a sign bit SGB of 0 to the 5-bit comparison value, i.e., the 5-bit immediately previous latched output DTp, as its most significant bit, thus generating a binary 6-bit data value D1. As illustrated in FIG. 4, the binary 6-bit data value D1 consists of a first bit corresponding to the least significant bit LSB, a second bit, a third bit, a fourth bit, a fifth bit, and a sixth bit corresponding to the most significant bit, i.e., the sign bit SGB. The first, second, third, fourth, fifth, and sixth bits of the binary 6-bit data value D1 can be respectively expressed by ENCO<1>, ENCO<2>, ENCO<3>, ENCO<4>, ENCO<5>, and ENCO<6> in FIG. 4.

Similarly, the first calculator 28A is configured to, as illustrated in FIG. 4, attach the sign bit SGB of 0 to the newest 5-bit output DTp as its most significant bit, thus generating a binary 6-bit data value D2.

Then, the first calculator 28A is configured to subtract, from each bit of the binary 6-bit data value D2, the corresponding bit of the binary 6-bit data value D1, thus calculating a binary 6-bit data value D3 consisting of a first bit corresponding to the least significant bit LSB, a second bit, a third bit, a fourth bit, a fifth bit, and a sixth bit corresponding to the most significant bit, i.e., the sign bit SGB.

The fifth bit of the binary 6-bit data value D3, which is a bit next to the most significant bit (the sign bit SGB) will be referred to as a second significant bit tMSB. That is, the second significant bit tMSB of the binary data value D3 is the most significant bit except for the sign bit SGB of the binary data value D3.

The second calculator 28B is configured to, as illustrated in FIG. 4, calculate the sum of the sixth bit, i.e., the sign bit SGB, and the fifth bit, i.e., the second significant bit tMSB, and select, from the calculation result, the least significant bit (see reference character SUM in FIG. 4).

Then, the second calculator 28B is configured to
(1) Extract, from the binary 6-bit data value D3, the first bit (LSB), the second bit, the third bit, and the fourth bit to thereby calculate a 4-bit string consisting of the first bit (LSB), the second bit, the third bit, and the fourth bit
(2) Combine the selected bit SUM with the 4-bit string to thereby generating a 5-bit data value DTc2 consisting of the first bit (LSB), the second bit, the third bit, the fourth bit, and the bit SUM serving as the most significant bit of the 5-bit data value DTc2

The first, second, third, fourth, and fifth bits of the 5-bit data value DTc2 can be respectively expressed by DT<1>, which is the least significant bit LSB, DT<2>, DT<3>, DT<4>, and DT<5>, which is the most significant bit MSB, in FIG. 4.

That is, the second output unit 25 is configured to subtract, from each bit of the binary 6-bit data value D2, the corresponding bit of the binary 6-bit data value D1, and output the 5-bit data value DTc2.

The following describes an example of the calculation performed by the first output unit 15 of the first digitizing unit 10.

As described above, the pulse delay circuit 11 is comprised of X delay units 12, 13; the number X is set to 15, i.e., $(2^{n=4}-1)$. For this reason, the output DTp of the encoder 16 of the first output unit 15 is a binary 4-bit data value.

For example, FIG. 5A illustrates an example of subtraction of "13", which is 4-bit binary data value (1101) from "17", which is 4-bit binary data value (0001) equal to 1.

A two's complement of 1101 (13) is calculated, and each bit of 1101 is inverted to thereby obtain 0010. The value 0010 is assed to 0001 (1), so that 0011 (−13) is calculated as the two's complement of 1101 (13). Then, the sum of 0001 (13=1) and 0011 (−13) is calculated, making it possible to obtain, as the sum, 0100 as a binary data value corresponding to 4.

Next, the following describes, with reference to FIG. 6A, a comparison example of the calculation performed by the second output unit 25 of the second digitizing unit 20 under the following condition, like the above patent publication, that no sign bit is used.

As described above, the pulse delay circuit 21 is comprised of m delay units 12, 13; the number Y is set to 17, i.e., $(2^{n=4}+1)$. For this reason, the output DTp of the encoder 26 of the second output unit 25 is a binary 5-bit data value.

For example, let us consider a case where the adder 28 of the second output unit 25 subtracts, from "17", which is 5-bit binary data value (00001) equal to 1, as the newest output DTp of the encoder 26, "13", which is 5-bit binary data value (01101) as the comparison value, i.e., the immediately previous latched output DTp. That is, the adder 28 calculates the following expression (17-13).

Note that, as described above, the overflow of the pulse delay circuit 21 shows a situation where the pulse signal PA returns from the last delay unit (129-th delay unit) 13 to the beginning first delay unit 12 (NAND gate 12).

Specifically, as described above, the adder 28 calculates a two's complement of 01101 (13). Specifically, the adder 28 inverts each bit of 01101 to thereby obtain 10010, and adds 10010 to 00001 (1), thus calculating, as the two's complement of 01101 (13), 10011 (−13). Then, the adder 28 calculates the sum of 00001 (13=1) and 10011 (−13) to thereby obtain 10011 as the binary data value DTc1 corresponding to 20, which is an anomalous calculation decision of (17-13).

The reasons why such an anomalous calculation decision is obtained are, for example, that
(1) The overflow of the pulse delay circuit 21 results in the maximum value 11111 as the output DTp of the encoder 26 returns to 00001, because the excess most significant bit "1" overflows from the size of 5-bit binary data value
(2) The most significant bit MSB of the two's complement 10011 of 01101 (13) becomes 1, and the most significant bit MSB (1) of the two's complement 10011 is attached to the sum of 00001 (13=1) and 10011 (−13).

For addressing the occurrence of such an anomalous calculation decision, the second output unit 25 of the second digitizing unit 20 calculates, as illustrated in FIG. 6B, the subtraction of "13", which is 5-bit binary data value (01101), from "17", which is 5-bit binary data value (00001) equal to 1, as follows:

Specifically, the first calculator 28A attaches the sign bit SGB of 0 to 01101 (13) to thereby generate a binary 6-bit data value D1 of 001101, and similarly attaches the sign bit SGB of 0 to 00001 (1) to thereby generate a binary 6-bit data value D2 of 000001.

Next, the first calculator 28A calculates a two's complement of 001101 (13). Specifically, the first calculator 28A inverts each bit of 001101 to thereby obtain 110010, and adds 110010 to 000001 (1), thus calculating, as the two's complement of 001101 (13), 110011 (−13). Subsequently, the first calculator 28A calculates the sum of 000001 (13=1) and 110011 (−13) to thereby obtain 110100 as a binary 6-bit data D3.

Then, the second calculator 28B calculates the sum of the sixth bit, i.e., the sign bit SGB, "1" and the fifth bit, i.e., the second significant bit tMSB, "1" of the binary 6-bit data D3 (110100), and selects, from the calculation result "10", the least significant bit "0".

Next, the second calculator 28B extracts, from the binary 6-bit data D3 (110100), the first bit, i.e., the least significant bit, (0), the second bit (0), the third bit (1), and the fourth bit (0) to thereby calculate a 4-bit string (0100) consisting of the first bit (0), the second bit (0), the third bit (1), and the fourth bit (0).

Then, the second calculator 28B combines the selected bit "0" with the 4-bit string (0100), thus obtaining 00100 as the binary data value DTc2 corresponding to 4, which is the correct calculation decision of (17-13).

Figure 3:
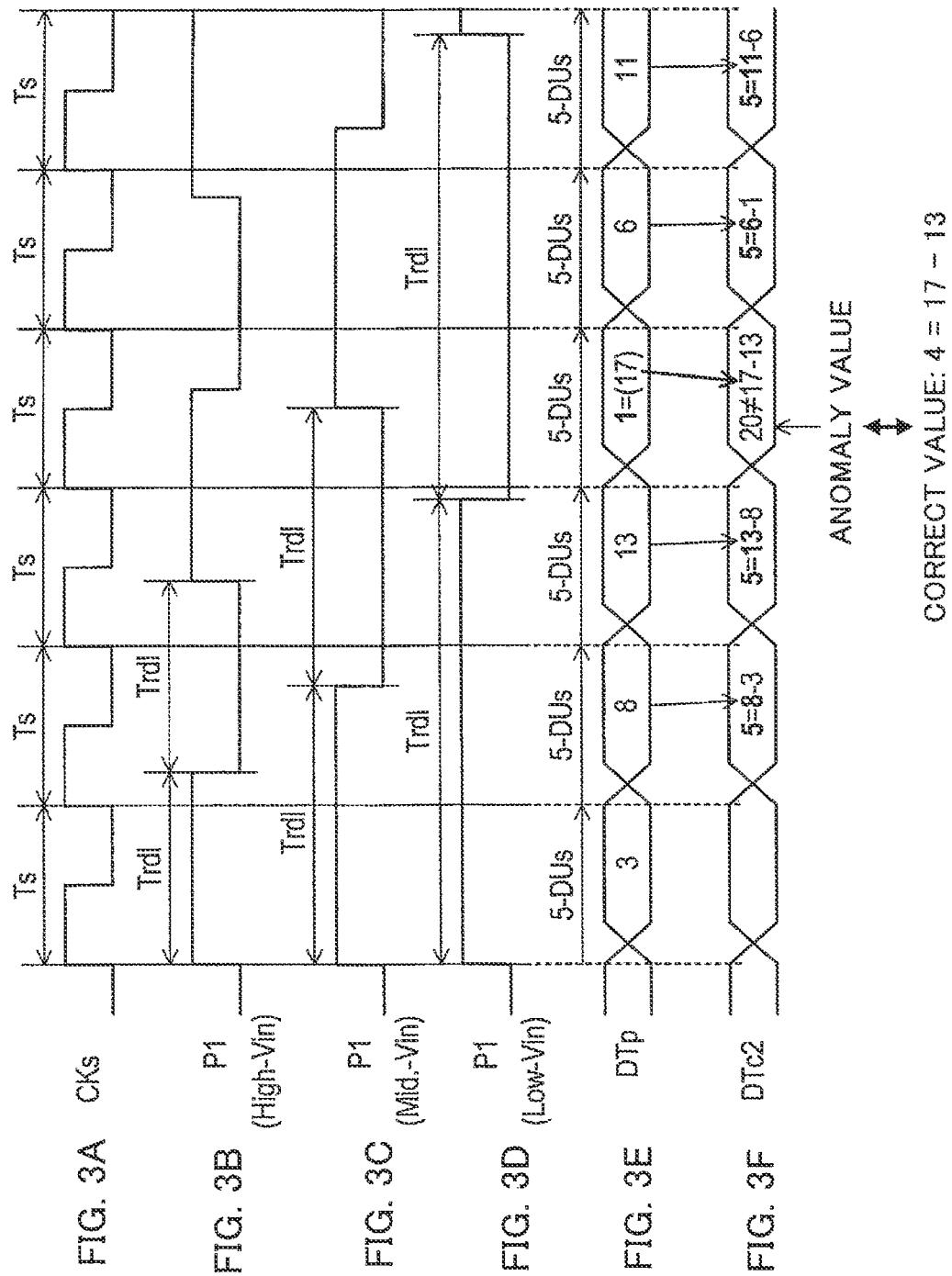
FIGS. 3A to 3F are a joint timing chart schematically illustrating how the A/D converter operates.

FIG. 3 illustrates an example of the output DTp of the encoder 26 of the second digitizing unit 20 and an example of the final output DTc2 of the second digitizing unit 20.

Let us assume that the pulse signal PA has passed through five delay units in the delay units 12 and 13, and the output DTp of the encoder 26 is captured for every cycle of the reference clock CKs. This results in the output DTp of the encoder 26 increasing by 5 for every cycle of the reference clock CKs. For example, 3 of the output DTp of the encoder 26 becomes 8 after lapse of one cycle of the reference clock CKs, and 13 after lapse of cycle of the reference clock CKs. At that time, 13 of the output DTp of the encoder 26 does not become 18 but becomes 17 after lapse of the cycle of the reference clock CKs, because a decrease of 1 has occurred in the least significant bit of the output DTp of the encoder 26 due to the overflow as an anomalous code decrease.

Although not illustrated in the exemplary embodiment, 13 of the output DTp of the encoder 16 does not become 17 or 18 but becomes 19 after lapse of cycle of the reference clock CKs, because an increase of 1 has occurred in the least significant bit of the output DTp of the encoder 16 due to the overflow as an anomalous code increase.

For example, let us consider a case where, as illustrated in FIG. 5B, the adder 18 of the first output unit 15 subtracts, from "19", which is 4-bit binary data value (0003) equal to 3, as the newest output DTp of the encoder 16, "13", which is 4-bit binary data value (1101) as the comparison value, i.e., the immediately previous latched output DTp. That is, the adder 18 calculates the following expression (19-13).

The adder 18 calculates a two's complement of 1101 (13). Specifically, the adder 18 inverts each bit of 1101 to thereby obtain 0010, and adds 0010 to 0001 (1), thus calculating, as the two's complement of 1101 (13), 0011 (−13). Then, the adder 18 calculates the sum of 0003 (19=3) and 0011 (−13) to thereby obtain 0110 as the binary data value DTc1 corresponding to 6, which is the correct calculation decision of (19-13).

Figure 7A:
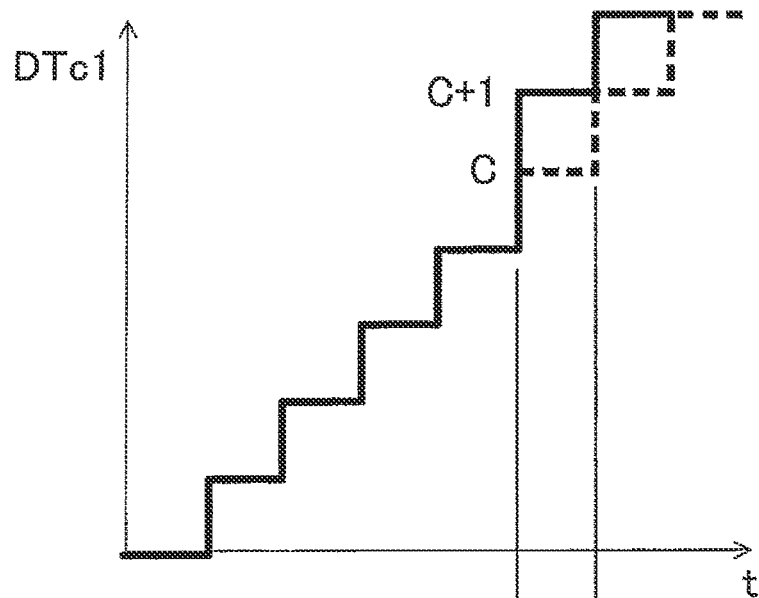
FIGS. 7A and 7B are a joint graph illustrating an increase of 1 in the least significant bit of the output of the first output unit, and a decrease of 1 in the least significant bit of the output of the second output unit.
Figure 7B:
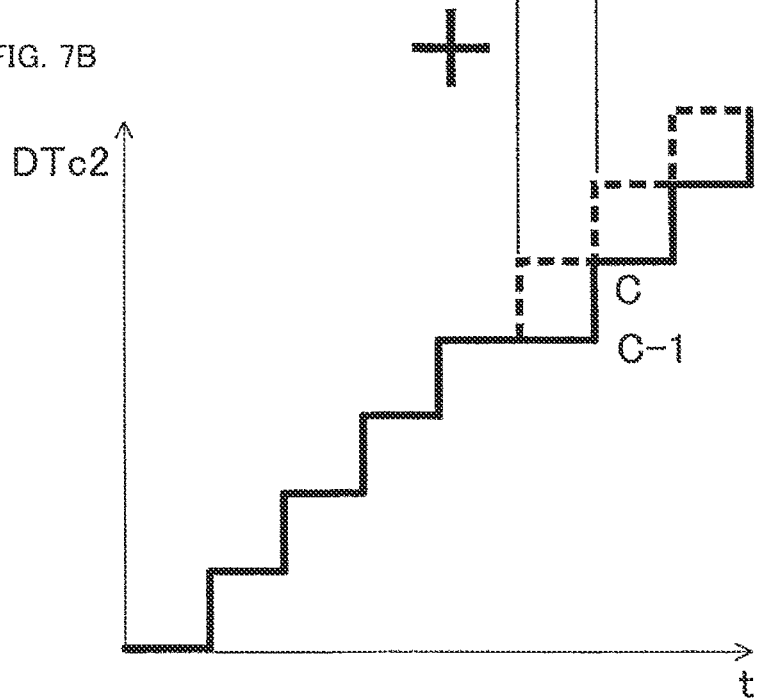

As described above, because the number X of the delay units 12, 13 included in the pulse delay circuit 11 is 127, i.e., $(2^{n=7}-1)$, the output (binary data value) DTc1 of the first digitizing unit 10 may become a value larger by 1 than a correct value C (see FIG. 7A). Similarly, because the number Y of the delay units 12, 13 included in the pulse delay circuit 21 is 129, i.e., $(2^{n=7}+1)$, the output (binary data value) DTc2 of the second digitizing unit 20 may become a value smaller by 1 than the correct value C (see FIG. 7B).

Figure 8:
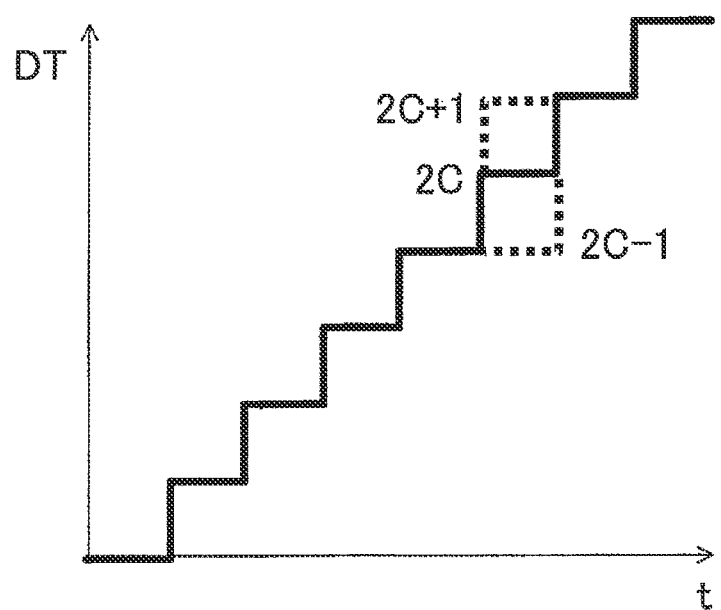
FIG. 8 is a graph schematically illustrating how the increase of 1 in the least significant bit of the output of the first output unit and the decrease of 1 in the least significant bit of the output of the second output unit cancel each other out.

From this viewpoint, the sum output unit 40 is configured to calculate the sum of the binary data value DTc1 and the binary data value DTc2, which can be represented by (DTc1+DTc2), to accordingly obtain a digital data value DT. Even if an increase of 1 of the least significant bit of the binary data value DTc1, which is expressed as (2C+1), and a decrease of 1 of the least significant bit of the binary data value DTc2, which is expressed as (2C−1), have occurred simultaneously, the above configuration of the sum output unit 40 results in, as illustrated in FIG. 8, the increase of 1 and the decrease of 1 cancelling each other out, making it possible to output a correct value 2C as the digital data value DT that is the result of analog-to-digital conversion of the analog signal VIN.

As described above, the A/D converter 1 according to the exemplary embodiment achieves the following advantageous benefits.

Specifically, the A/D converter 1 according to the exemplary embodiment is configured to digitize predetermined analog information.

The A/D converter 1 includes the first digitizing unit 10, the second digitizing unit 20, and the sum output unit 40.

The first digitizing unit 10 is comprised of the ring-like pulse delay circuit 11 and the first output unit 15. The pulse delay circuit 11 is comprised of the X delay units 12, 13 connected in series to one another in a ring form; the number X of delay units 12, 13 serves as the number X of stages of delay. The number X is set to an odd number of, for example, 127, i.e., $(2^n-1)$; n is a natural number, i.e., an integer more than or equal to 1.

The first output unit 15 is configured to output, as the binary data value DTc1, an n-bit data value based on the number of delay units 12, 13 in the pulse delay circuit 11 through which the pulse signal PA has passed.

The second digitizing unit 20 is comprised of the ring-like pulse delay circuit 21 and the second output unit 25. The pulse delay circuit 21 is comprised of the Y delay units 12, 13 connected in series to one another in a ring form; the number Y of delay units 12, 13 serves as the number Y of stages of delay. The number Y is set to an odd number of, for example, 129, i.e., $(2^n+1)$.

The second output unit 25 is configured to output, as the binary data value DTc2, an (n+1)-bit data value based on the number of delay units 12, 13 in the pulse delay circuit 21 through which the pulse signal PA has passed.

Each delay unit 12, 13 of each pulse delay circuit 11, 21 is configured such that the operating time of the corresponding delay unit depends on the voltage of the analog signal VIN, resulting in the delay time of each delay unit 12, 13 depending on the voltage of the analog signal VIN.

The sum output unit 40 is configured to calculate the sum of the n-bit data value outputted from the first output unit 15 and the (n+1)-bit data value outputted from the second output unit 25 to accordingly obtain the calculated sum as the digital data value DT; the digital data value DT is the result of analog-to-digital conversion of the analog signal VIN.

In particular, the second output unit 25 includes the encoder 26, the first calculator 28A, and the second calculator 28B.

The encoder 26 is configured to encode, every predetermined period, the number of delay units 12, 13 in the pulse delay circuit 21 through which the pulse signal PA has passed, to accordingly generate, every predetermined period, a binary data value.

The first calculator 28A is configured to
1. Attach, to a newest binary data value, a sign bit as a most significant bit of the newest binary data value to thereby calculate a first binary data value
2. Attach, to a previous binary data value generated immediately previous to the newest binary data value, the same sign bit as the most significant bit of the previous binary data value to thereby calculate a second binary data value
3. Subtract, from the first binary data value, the second binary data value using a two's complement of the second binary data value to accordingly calculate a third binary data value The second calculator 28B is configured to
1. Calculate the sum of a sign bit of the third binary data value as a most significant bit thereof and a second significant bit of the third binary data value
2. Select, from the sum of the sign bit and the second significant bit of the third binary data value, a least significant bit
3. Combine the selected least significant bit with the third binary data value from which the sign bit has been eliminated to accordingly generate, as the binary data value DTc2, i.e., the (n+1)-bit data value, a new binary data value whose most significant bit is the selected least significant bit This configuration of the A/D converter 1 makes it possible to prevent a calculation decision of the A/D converter 1 from becoming an anomalous value due to, for example, the occurrence of the overflow of, for example, the ring-like pulse delay circuit 21.

Additionally, as described above, making larger the sample period and faster the delay time of each delay unit 12, 13 enables the A/D converter 1 to have a higher resolution and a faster conversion speed.

This therefore offers the A/D converter 1 with a higher accuracy while maintaining a faster conversion speed and a higher resolution.

The A/D converter 1 configured set forth above serves as a complementary A/D converter, therefore making it possible to mutually complement (i) an increase of 1 of the least significant bit of the binary data value DTc1, which may occur in the ring-like delay circuit 11, and (ii) a decrease of 1 of the least significant bit of the binary data value DTc2, which may occur in the ring-like delay circuit 21, with one another.

Each of the delay units 12 and 13 according to the exemplary embodiment is configured such that the analog signal VIN having a predetermined voltage is inputted thereto through the positive power supply line L1. Each of the first and second output units 15 and 25 is configured to digitize the number of delay units 12, 13 in the corresponding one of the pulse delay circuits 15 and 21 through which the pulse signal PA has passed for a predetermined time, and output the corresponding one of the digitized numbers as the corresponding one of the binary data values DTc1 and DTc2.

These configurations therefore make it possible to output a digitized value based on the voltage of the analog signal as the binary data values DTc1 and DTc2.

In each of the ring-like delay units 11 and 21, the delay units 13 except for the delay unit 12 to which the pulse signal PA is inputted can be comprised of a simpler semiconductor element, such as an inverter, resulting in the A/D converter 1 having a smaller size.

The present disclosure is however not limited to the above exemplary embodiment, and can be variously modified or expanded as follows.

The ring-like pulse delay circuit 11 is comprised of X delay units 12, 13, the number X being set to $2^n-1$, and the ring-like pulse delay circuit 21 is comprised of Y delay units 12, 13, the number Y being set to $2^n+1$. The present disclosure is however not limited thereto.

For example, the ring-like pulse delay circuit 11 can be comprised of X1 delay units 12, 13, the number X1 being set to $2^n-(2m-1)$, and the ring-like pulse delay circuit 21 is comprised of Y1 delay units 12, 13, the number Y1 being set to $2^n+(2m-1)$; m is a natural number, and n is more than or equal to m.

This modified A/D converter 1 results in the number of delay units 12, 13 included in each of the ring-like delay units 11 and 21 being an odd number.

In each of the ring-like delay units 11 and 21, the delay units 13 except for the delay unit 12 to which the pulse signal PA is inputted can be comprised of a simpler semiconductor element, such as an inverter, resulting in the modified A/D converter 1 having a smaller size.

The ring-like pulse delay circuit 11 can be comprised of X2 delay units 12, 13, the number X2 being an even number of $2^n-p$, and the ring-like pulse delay circuit 21 is comprised of Y2 delay units 12, 13, the number Y2 being an even number of $2^n+p$; p is a natural number and $2^{n-1}$ is more than p ($2^{n-1}>p$).

This modified configuration of the A/D converter 1 makes it possible to relatively reduce an error due to anomalous code decrease or anomalous code increase.

Each of the pulse delay circuits 11 and 21 is comprised of a plurality of delay units 12, 13 connected in series to one another in a ring form, but the present disclosure is not limited thereto.

Specifically, each of the pulse delay circuits 11 and 21 can be comprised of a plurality of delay units 12, 13 connected in series to one another in line, and can be configured such that, in response to the pulse signal PA passing through the last delay unit 13, another pulse signal is inputted to the first delay unit 12.

The exemplary embodiment shows an example where the ring-like pulse delay circuits 11 and 21 is applied to the A/D converter 1, but the present disclosure is not limited thereto.

Specifically, the ring-like pulse delay circuits 11 and 21 can be applied to an A/D converter circuit for digitizing predetermined analog information, such as time, temperature, stress, or another physical analog information.

For example, the A/D converter 1 can be configured such that (1) The voltage of the analog signal VIN is constant
(2) The bias voltage VBB is constant
(3) The ground voltage GND is constant
(4) The reference clock CKs is inputted to the A/D converter 1 at a measurement start time and thereafter also inputted thereto at a measurement end time This enables the A/D converter 1 to serve as a time-based A/D converter circuit for digitizing a difference between the time between the measurement end time and the measurement start time.

As another example, the A/D converter 1 can be configured such that (1) The voltage of the analog signal VIN is constant
(2) The bias voltage VBB is constant
(3) The ground voltage GND is constant
(4) The period Ts of the reference clock CKs is constant
(5) Obtained values of the digital data value DT for respective periods Ts of the reference clock CKs are respectively stored to correlate with corresponding current values of ambient temperature around the A/D converter 1 or corresponding respective values of stress applied to the A/D converter 1

This makes it possible to measure a current value of the ambient temperature based on an actually obtained value of the digital data value DT outputted from the A/D converter 1 serving as a temperature digitizing apparatus, and measure a current value of the stress applied to the A/D converter 1 serving as a stress digitizing apparatus based on an actually obtained value of the digital data value DT outputted from the A/D converter 1.

The functions of one element in the exemplary embodiment and its modifications can be distributed as plural elements, and one function of one element can be implemented by plural elements. The functions that plural elements have can be implemented by one element, and one function implemented by plural elements can be implemented by one element. At least part of the structure of each of the exemplary embodiment and its modifications can be eliminated. At least part of one of the exemplary embodiment and its modifications can be added to the structure of another of the exemplary embodiment and its modifications, or can be replaced with a corresponding part of another of the exemplary embodiment and its modifications.

The present disclosure can be implemented by various embodiments in addition to the A/D converter 1; the various embodiments include (i) A/D converter circuits each including the pulse delay circuits 11 and 21, (ii) systems each include such an A/D converter circuit, and (iii) methods for digitizing predetermined analog information.

While illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. An analog-to-digital converter circuit for digitizing predetermined analog information, the analog-to-digital converter circuit comprising:
   a first digitizing unit that comprises:
      a first pulse delay circuit comprising a predetermined number of first delay units connected in series, the predetermined number of first delay units being ($2^n$−p), each of n and p being individually a natural number, each first delay unit being configured such that an analog signal having a voltage is inputted thereto, the first pulse delay circuit being configured to transfer a pulse signal therethrough while the pulse signal is delayed by each first delay unit, a delay time of each first delay unit depending on a voltage of the analog signal; and
      a first output unit configured to output a first n-bit data value based on the number of first delay units in the first pulse delay circuit through which the pulse signal has passed;
   a second digitizing unit that comprises:
      a second pulse delay circuit comprising a predetermined number of second delay units connected in series, the predetermined number of second delay units being ($2^n$+p), each second delay unit being configured such that the analog signal is inputted thereto, the second pulse delay circuit being configured to transfer the pulse signal therethrough while the pulse signal is delayed by each second delay unit, a delay time of each second delay unit depending on the voltage of the analog signal; and
      a second output unit configured to output a second (n+1)-bit data value based on the number of second delay units in the second pulse delay circuit through which the pulse signal has passed;
   a sum output unit configured to calculate the sum of the n-bit data value outputted from the first output unit and the (n+1)-bit data value outputted from the second output unit to accordingly obtain the calculated sum as a digital data value, wherein the second output unit comprises:
      an encoder configured to encode, every predetermined period, a value indicative of the number of second delay units in the second pulse delay circuit through which the pulse signal has passed, to accordingly generate, every predetermined period, a digital data value;
      a first calculator configured to:
         attach, to a newest digital data value, a sign bit as a most significant bit of the newest digital data value to thereby calculate a first digital data value;
         attach, to a previous digital data value generated immediately previous to the newest digital data value, the same sign bit as a most significant bit of the previous digital data value to thereby calculate a second digital data value; and
         perform subtraction of the second digital data value from the first digital data value to accordingly calculate a third digital data value; and
      a second calculator configured to
         calculate the sum of a sign bit of the third digital data value as a most significant bit thereof and a second most significant bit of the third digital data value; and
         combine a bit selected from the calculated sum of the sign bit and the second most significant bit with the third digital data value from which the sign bit has been eliminated to accordingly generate, as the (n+1)-bit data value, a new digital data value whose most significant bit is the bit selected from the calculated sum of the sign bit and the second most significant bit.

2. The analog-to-digital converter circuit according to claim 1, wherein:
   p is set to 2m−1, so that the predetermined number of first delay units is $2^n$−(2m−1), and the predetermined number of second delay units is $2^n$+(2m−1), m being a natural number, n being more than or equal to m.

3. The analog-to-digital converter circuit according to claim 2, wherein:
   m is set to 1, so that the predetermined number of first delay units is $2^n$−1, and the predetermined number of second delay units is $2^n$+1.

4. The analog-to-digital converter circuit according to claim 1, wherein:
   each of the first and second delay units is configured such that the analog signal is inputted thereto through a power supply line;
   the first output unit is configured to:
      digitize the number of first delay units in the first pulse delay circuit through which the pulse signal has passed for a predetermined time; and
      output the digitized number as the n-bit digital data value; and
   the second output unit is configured to:
      digitize the number of second delay units in the second pulse delay circuit through which the pulse signal has passed for the predetermined time; and
      output the digitized number as the (n+1)-bit digital data value.

5. The analog-to-digital converter circuit according to claim 1, wherein:
   the first calculator is configured to perform, as the subtraction, a task of:
   calculating a two's complement of the second digital data value; and
   calculating the sum of the first digital data value and the two's complement of the second digital data value to accordingly obtain the third digital value.

* * * * *